United States Patent [19]
Matsubara

[11] Patent Number: 5,563,100
[45] Date of Patent: Oct. 8, 1996

[54] FABRICATION METHOD OF SEMICONDUCTOR DEVICE WITH REFRACTORY METAL SILICIDE FORMATION BY REMOVING NATIVE OXIDE IN HYDROGEN

[75] Inventor: Yoshihisa Matsubara, Tokyo, Japan

[73] Assignee: NEC Corporation, Japan

[21] Appl. No.: 357,403

[22] Filed: Dec. 16, 1994

[30] Foreign Application Priority Data

Dec. 16, 1993 [JP] Japan .................................. 5-317007
[51] Int. Cl.$^6$ .................................................. H01L 21/28
[52] U.S. Cl. ........................ 437/200; 437/238; 437/937; 148/DIG. 17
[58] Field of Search ................................ 437/200, 238, 437/201, 937; 148/DIG. 17

[56] References Cited

U.S. PATENT DOCUMENTS

| | | | |
|---|---|---|---|
| 4,940,509 | 7/1990 | Tso et al. ................................. | 156/653 |
| 5,023,201 | 6/1991 | Stanasolovich et al. ............... | 437/200 |
| 5,089,441 | 2/1992 | Moslehi .................................. | 437/937 |
| 5,316,977 | 5/1994 | Kunishima et al. .................... | 437/200 |
| 5,338,697 | 8/1994 | Aoki et al. ............................. | 437/40 |

FOREIGN PATENT DOCUMENTS 3-263830  11/1991  Japan .
4-226024   8/1992  Japan .

OTHER PUBLICATIONS

Motakef, S., et al., *J. Appl. Phys.* 70(5), "Stability of C49 and C54 phases of TiSi$_2$ under ion bombardment," 1 Sep. 1991, pp. 2660–2666.
Nolan, T. P., et al., *J. Appl. Phys.*, 71(2), "Modeling of agglomeration in polycrystalline thin films: Application to TiSi$_2$ on a silicon substrate," 15 Jan. 1992, pp. 720–724.

*Primary Examiner*—George Fourson
*Assistant Examiner*—Thomas G. Bilodeau

[57] ABSTRACT

A fabrication method of a semiconductor device in which a refractory metal silicide film with a low sheet-resistance can be produced. First, a substructure made of Si-contained material is prepared, the surface of which is covered with a native SiO$_2$ film. The substructure is typically a single-crystal Si substrate or a polysilicon film. Next, the native SiO$_3$ film is reduced to be removed from the substructure in a hydrogen atmosphere whose pressure is from $1 \times 10^{-6}$ to $1 \times 10^3$ Torr. Then, a refractory metal film is formed on the surface of the substructure without exposing the substructure to the atmospheric pressure. The refractory metal film is in contact with the uncovered surface of the substructure. The refractory metal film is subjected to a heat-treatment process to react with the substructure, so that a refractory metal silicide film of a first phase is formed at the interface of the refractory metal film and the substructure. After the unreacted refractory metal film is removed from the substructure, the substructure is subjected to another heat-treatment process to transform in phase said refractory metal silicide film of said first phase to be that of a second phase lower in resistivity than that of said first phase.

18 Claims, 5 Drawing Sheets

5,563,100

FABRICATION METHOD OF SEMICONDUCTOR DEVICE WITH REFRACTORY METAL SILICIDE FORMATION BY REMOVING NATIVE OXIDE IN HYDROGEN

BACKGROUND OF THE INVENTION

1. Field of the Invention

The present invention relates to a fabrication method of a semiconductor device and more particularly, to a fabrication method of a semiconductor device containing a formation process of a refractory metal silicide film on a semiconductor material, which is preferably applicable for fabrication of a metal-oxide-semiconductor field-effect transistor (MOSFET) on a silicon substrate.

2. Description of the Prior Art

In recent years, semiconductor devices such as very-large-scale integrated circuit devices (VLSIs) have been finely-structured and large-scale integrated more and more so that the submicron-order fine line technology has been popularly adopted. For this reason, a problem that the circuit operation of the VLSI is delayed due to sheet resistance increase has occurred.

For example, with an MOSFET, both a gate electrode and a pair of diffusion regions forming source/drain regions have been increasingly reduced in size. As a result, the circuit operation using the MOSFET has tended to be delayed due to the sheet resistance increase of conductor films employed in the MOSFET.

To solve such the problem in the finely-structured MOSFET, various resistance-reduction techniques using refractory metal silicides were developed and employed. More recently, as one of the resistance-reduction techniques, the application of a self-aligned silicide film (SALICIDE technique) containing titanium (Ti) to the MOSFET has received much attention.

In addition, with such finely-structured MOSFET, the source/drain diffusion regions needs to be formed shallower in a semiconductor substrate and at the same time, the Ti silicide film applied thereto needs to be thinner in order to restrain an electric current leakage.

In the above SALICIDE technique, the Ti silicide ($TiSi_2$) film is, in general, produced by utilizing two solid-phase reactions.

The first reaction is a solid-phase diffusion reaction of a Ti film with a single-crystal silicon (Si) region or a polysilicon film contacted with the Ti film.

The second reaction is the structural phase transformation from the C49 phase to the C54 phase of $TiSi_2$. The C49 phase is a non equilibrium phase and has a relatively higher resistivity of $2 \times 10^{-4}$ $\Omega \cdot cm$, and the C54 phase is an equilibrium phase and has a relatively lower resistivity of $1.5 \times 10^{-5}$ $\Omega \cdot cm$. If such the two reactions are not performed sufficiently, a satisfactorily low sheet resistance of $TiSi_2$ cannot be obtained.

A native oxide film of Si, i.e., a silicon dioxide ($SiO_3$) film is one of the hindering or obstructing factors to the reactions. This $SiO_2$ film restrains, in general, the solid-phase reaction between a Ti film formed by sputtering and a Si material contacted therewith. Accordingly, a resultant $TiSi_2$ film not only has an unsatisfactory uniformity in thickness but also contains oxygen (O).

Additionally, the oxygen contained in the Ti silicide film causes a problem in that the oxygen restrains the diffusion of the Ti and Si atoms that occurs simultaneously with the C49/C54 phase transformation, raising the phase-transformation temperature. As the $TiSi_2$ film becomes thinner, the oxygen contained in the $TiSi_2$ film increases in concentration.

Hence, it is especially important for the formation process of the $TiSi_2$ film to prevent the native $SiO_2$ film from occurring and to restrain the oxygen from doping.

Conventionally, to avoid the effects of the native $SiO_2$ film, a method using an etching process was developed, which is disclosed in the Japanese Non-Examined Patent Publication No. 4-226024 (August 1992). This method is termed a first conventional method here.

In this method, the native $SiO_2$ film is removed by plasma etching in the way shown in FIGS. 1A to 1E.

First, as shown in FIG. 1A, a gate $SiO_2$ film 12 is selectively formed on the surface of a single-crystal Si substrate 11 and then, a gate electrode 13 made of a patterned polysilicon film is formed on the film 12.

Next, a pair of lightly-doped diffusion regions are formed in the substrate 11 in self-alignment to the gate electrode 13 by ion-implantation. A pair of sidewall spacers 14 are formed on the gate $SiO_2$ film 12 at each side of the gate electrode 13.

Subsequently, a pair of heavily-doped diffusion regions are formed in the substrate 11 in self-alignment to both of the gate electrode 13 and the sidewall spacers 14 by ion-implantation. Thus, a pair of source/drain regions 15 with the Lightly-Doped Drain (LDD) structure are formed in the substrate 11, as shown in FIG. 1A.

As a pretreatment of deposition of a Ti film, the substrate 11 is immersed into a mixture solution of sulfuric acid ($H_2SO_4$) and hydrogen peroxide ($H_2O_2$). Then, the uncovered surfaces of the source/drain regions 15 and the uncovered surface of the gate electrode 13 are etched by using a 10% hydrofluoric acid (HF) solution in order to clean the uncovered surfaces.

After this etching process, the substrate 11 is taken out of the HF solution. At this time, these uncovered surfaces thus cleaned of the substrate 11 are exposed to the atmosphere, so that they are oxidized by oxygen contained in the atmosphere, resulting in a native $SiO_2$ film 16 on the uncovered surfaces, respectively, as shown in FIG. 1A.

Following this, the substrate 11 is placed on a holder in a vacuum chamber of a radio-frequency (rf) plasma etching system. In this system, the native $SiO_2$ film 16 is entirely removed from the substrate 11 using the rf-plasma generated in the chamber, as shown in FIG. 1B. Thus, all of the uncovered surfaces of the source/drain regions 15 and the gate electrode 13 are cleaned. An applied power is about 20 to 50 W and a reaction gas is nitrogen fluoride ($NF_2$) during this etching process.

A Ti film 17 is then formed on the entire substrate 11 by sputtering, as shown in FIG. 1C. The Ti film 17 is contacted with the uncovered surface of the gate electrode 13 and those of the source/drain regions 15, respectively. This film formation process of Ti is carried out under a vacuum to keep the uncovered surfaces clean.

The substrate 11 with the Ti film 17 is subjected to a first heat-treatment process either in an inert gas atmosphere of nitrogen (N) or argon (Ar), or in vacuum. Through this process, the element Ti in the Ti film 17 reacts with the element Si in the polysilicon gate electrode 13 and in the single-crystal Si source/drain regions 15 at their contact areas. As a result, TiSi$_2$ films 18 with the C49 structures or phases are formed at an interface of the Ti film 17 and the gate electrode 13 and at interfaces of the film 17 and the source/drain regions 15, respectively.

After the unreacted Ti film 17 is removed from the substrate 11 by etching, the substrate 11 is subjected to a second heat-treatment process at 800° to 900° C. in the same atmosphere as that of the first heat-treatment. Through this process, the TiSi$_2$ films 18 with the C49 structures are transformed in phase to TiSi$_2$ films 19 with C54 structures or phases. Since each C54-phase TiSi$_2$ film 19 has a relatively lower resistivity than that of each C49-phase TiSi$_2$ film 18, this phase transformation realizes the sheet resistance reduction of TiSi$_2$.

Another conventional method using a hydrogen gas (H$_2$) for removing the native SiO$_2$ film 16 was developed and described in the Japanese Non-Examined Patent Publication No. 3-263830 (November 1991). This method was developed to be employed to the epitaxial growth technology of semiconductor using a molecular-beam epitaxy (MBE) system. Also, this method is termed a second conventional method here.

In this second conventional method, an H$_2$ gas is heated up to 1000° C. or higher in a first vacuum chamber with a pressure of $1 \times 10^{-3}$ Torr to generate atomized hydrogen species. Also, a single-crystal Si substrate is placed on a holder in a second vacuum chamber whose pressure is lower than that of the first chamber, i.e., $1 \times 10^{-4}$ Torr. The atomized hydrogen species in the first chamber are then supplied to the second chamber to be irradiated to the substrate, removing a native SiO$_2$ film produced on the uncovered surface of the substrate.

The chemical reaction of the native oxide removal is

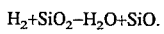

$$H_2 + SiO_2 \rightarrow H_2O + SiO.$$

The native SiO$_2$ film is reduced or deoxidized by H$_2$ to be evaporated from the substrate in the form of SiO. During this process, the partial pressure of SiO needs to be kept higher than the total pressure of the second vacuum chamber.

With the first conventional method using the plasma etching as shown in FIGS. 1A to 1E, there is a disadvantage that energetic ionic species such as N atoms contained in the plasma are doped into the substrate during the native oxide film removing process.

Similarly, with the second conventional method using the hydrogen reduction, the atomized hydrogen species are accelerated to be irradiated to the substrate utilizing the pressure difference between the first and second vacuum cambers. Accordingly, there is a disadvantage that the hydrogen atoms are doped into the substrate during the native oxide removing process.

The impurity atoms doped into the substrate such as N and H atoms raises the phase transformation temperature because the impurity atoms restrain the Ti and Si atoms from diffusing inside the TiSi$_2$ film. This is stated in detail in the Journal of Applied Physics, Vol. 70, No. 5, pp 2660–2666, September 1991.

From this paper, the above problem of increase of the phase transformation temperature can be solved by high-temperature annealing at a higher temperature than the phase transformation temperature. However, in the case of such the high-temperature annealing, there arises another problem that the TiSi$_2$ film tends to be discontinuous due to its agglomeration.

The reason of the discontinuity is considered as follows:

When the TiSi$_2$ film is heated up to 800° C. or higher, to reduce its resistivity through a phase transformation it starts to soften, being capable of flowing. The softened because of the impurity atoms doped into the TiSi$_2$ film; film tends to flow toward the surface of the TiSi$_2$ film and/or the interface of the TiSi$_2$ film and the Si material, so that the structure or constitution of the TiSi$_2$ film varies so as to minimize its internal energy. As a result, the TiSi$_2$ film becomes partially discontinuous, generating continuous regions and isolated island regions. This means that the TiSi$_2$ film tends to have both breakdown or snapping and loss of the thickness uniformity, so that the film deteriorates in conductivity and increases in sheet resistance.

Accordingly, it is seen that the above high temperature annealing is not suitable for the above resistance reduction purpose.

The above discontinuity of the TiSi$_2$ film due to agglomeration is stated in detail in the Journal of Applied Physics, Vol. 71, No. 2, pp 720–724, January 1992.

As described above, in view of the above resistance reduction purpose, the C54-phase TiSi$_2$ film with a relatively lower resistivity can be obtained only in the temperature range between the phase transformation temperature and the agglomeration temperature.

Therefore, a fabrication method that can produce such the low-resistivity TiSi$_2$ film without the above disadvantages has been required in order to realize finely-structured semiconductor devices.

SUMMARY OF THE INVENTION

Accordingly, an object of the present invention is to provide a fabrication method of a semiconductor device in which a refractory metal silicide film with a low sheet resistance can be formed without arising any problem.

Another object of the present invention is to provide a fabrication method of a semiconductor device in which a reliable refractory metal silicide film are obtained.

A fabrication method of a semiconductor device according to the present invention contains the following steps:

First, a substructure made of Si-containing material is prepared. The surface of the substructure is covered with a native SiO$_2$ film. The substructure is typically a single-crystal Si substrate or a polysilicon film.

Next, the native SiO$_2$ film is removed from the substructure by reduction or deoxidization in an H atmosphere whose pressure is from $1 \times 10^{-6}$ to $1 \times 10^{-2}$ Torr.

The H atmosphere is employed because the native SiO$_2$ film can be effectively removed without damage to the substructure.

The pressure range from $1 \times 10^{-6}$ to $1 \times 10^{-2}$ Torr is determined by the following reason. If this pressure is lower than $1 \times 10^{-6}$ Torr, satisfactory reduction or deoxidization does not occur, and if it is higher than $1 \times 10^{-2}$ Torr, an impurity tends to be doped into the substructure.

The preferable pressure range is from $1 \times 10^3$ to $1 \times 10^4$ Torr. Within this range, satisfactory reduction occurs and no impurity is doped into the substructure.

After the removal of the native SiO$_2$ film, a refractory metal film is formed on the surface of the substructure without exposing the substructure to the atmosphere. The refractory metal film thus formed is in contact with the uncovered surface of the substructure.

As the refractory metal film, any metal may be used if they have the melting point of 1500° C. or higher. For example, cobalt (Co), molybdenum (Mo) and nickel (Ni) may be preferably used.

The refractory metal film thus formed is then subjected to a heat-treatment to react with the substructure, so that a refractory metal silicide film is formed at an interface of the refractory metal film and the substructure.

Preferably, the heat-treatment is carried out at a temperature from 600° to 700° C. either in an inert atmosphere such as $N_2$ and Ar, or in vacuum.

The treatment period of time is preferably 10 to 60 sec. If it is less than 10 sec, insufficient temperature rise is obtained, and if it is more than 60 sec, the silicide film tends to be breakdown or snapped.

Finally, the unreacted refractory metal film is removed from the substructure.

With the method of the invention, since the native $SiO_2$ film is removed by reduction or deoxidization using $H_2$ from the substructure under the pressure of $1 \times 10^{-6}$ to $1 \times 10^{-2}$ Torr, and then, the refractory metal film is formed on the surface of the substructure without exposing to the atmosphere.

Therefore, no impurity is doped into the substructure through its surface, which means that no problem occurs due to the impurity.

Also, because such the high-temperature annealing process as described above is not required, no problem due to the agglomeration occurs.

As a result, a refractory metal silicide film with a low sheet resistance suitable for finely-structured semiconductor devices can be obtained without arising any problem.

In addition, since breakdown or snapping of the refractory metal silicide film does not arises due to the agglomeration, the resultant silicide film has improved reliability.

DETAILED DESCRIPTION OF THE PREFERRED EMBODIMENTS

Figure 1A:
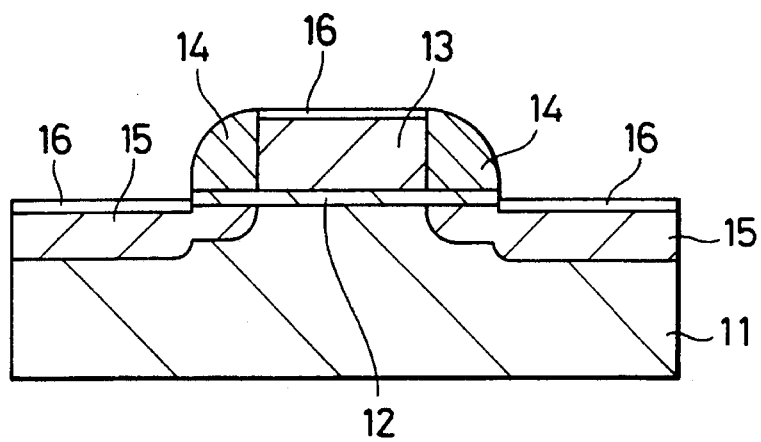
FIGS. 1A to 1E are partially cross-sectional views showing a conventional fabrication method of a semiconductor device, respectively.
Figure 1B:
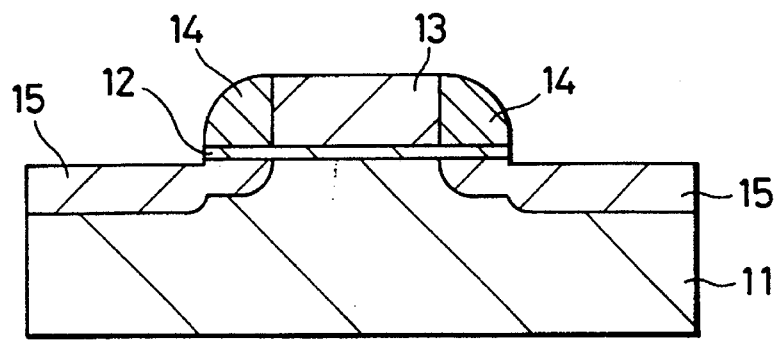
Figure 1C:
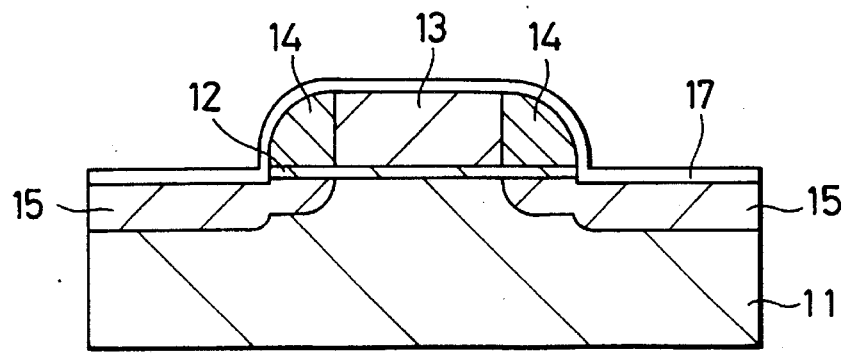
Figure 1D:
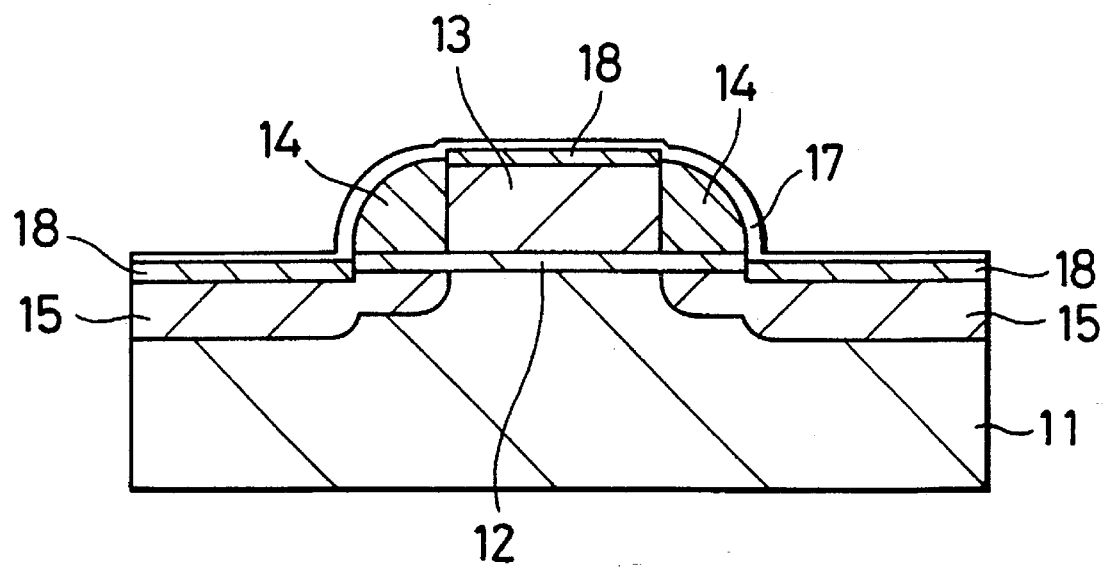
Figure 1E:
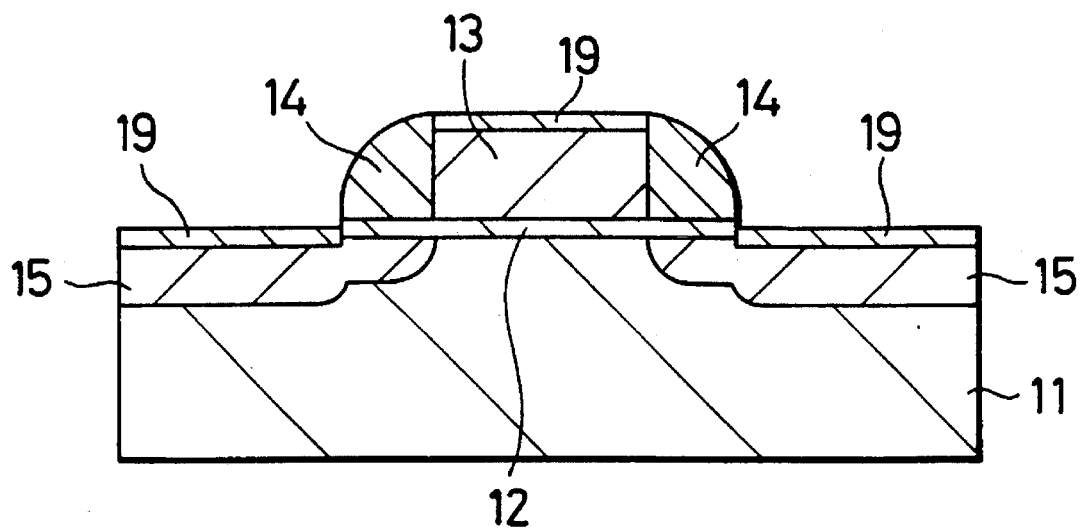

A preferred embodiment of the present invention will be described below referring to the drawings attached.

A fabrication method of an MOSFET according to an embodiment of the invention is shown, here. Needless to say, however, the invention can be applied to any other semiconductor devices.

Figure 2A:
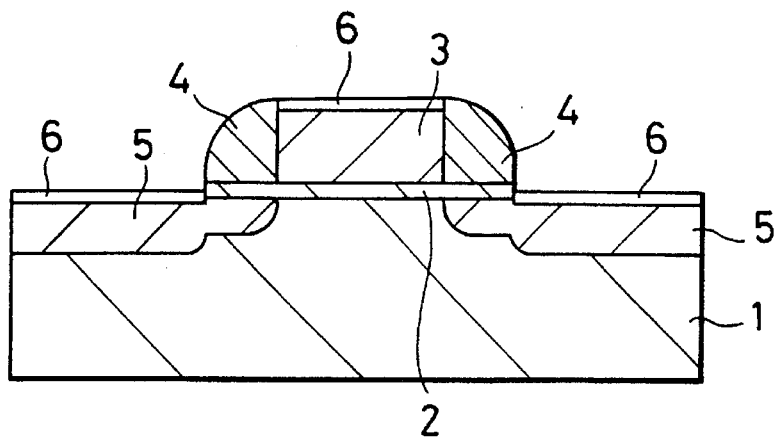
FIGS. 2A to E are partially cross sectional views showing a fabrication method of a semiconductor device according to an embodiment of the invention, respectively.

First, as shown in FIG. 2A, a gate $SiO_2$ film 2 is selectively formed on the surface of a p-type single-crystal Si substrate 1 and a gate electrode 3 made of a patterned polysilicon film is selectively formed on the film 2.

Next, a pair of n-type lightly-doped diffusion regions are formed in the substrate 1 in self-align to the gate electrode 3 by ion-implantation. A pair of sidewall spacers 4 are formed on the gate $SiO_2$ film 2 at each side of the gate electrode 3.

Subsequently, a pair of n-type heavily-doped diffusion regions are formed in the substrate 1 in self-align to both of the gate electrode 3 and the sidewall spacers 4 by ion-implantation. Thus, a pair of source/drain regions 5 with the Lightly-Doped Drain (LDD) structure are formed in the substrate 1, as shown in FIG. 2A.

At this time, the uncovered surfaces of the substrate 1, that is, the uncovered surfaces of the source/drain regions 5, and the uncovered surface of the gate electrode 3 are exposed to the atmosphere, so that they are oxidized by oxygen contained in the atmosphere. As a result, native $SiO_2$ films 6 are produced on these uncovered surfaces, respectively, as shown in FIG. 2A.

Figure 2B:
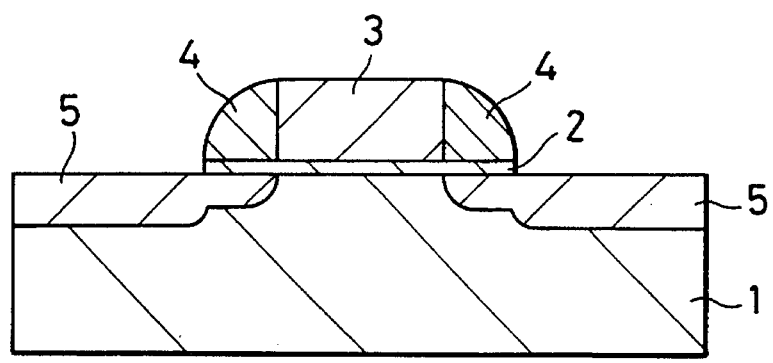

Following this, the substrate 1 is placed on a holder in a vacuum chamber. The substrate 1 is then subjected to a first heat-treatment process in a hydrogen atmosphere ($H_2$) whose pressure is from $1 \times 10^{-6}$ to $1 \times 10^{-2}$ Torr at a temperature from 700° to 850° C. for one minute, so that the native $SiO_2$ films 6 are removed entirely from the substrate 1 and the gate electrode 3, as shown in FIG. 2B.

The chemical reaction of this $SiO_2$ removal process is

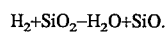

$$H_2 + SiO_2 \rightarrow H_2O + SiO.$$

It is seen from this chemical formula that the native $SiO_2$ films 6 are reduced or deoxidized by $H_2$ to be evaporated from the substrate 1 and the gate electrode 3 in the form of SiO, as in the second conventional method.

Then, a titanium (Ti) film 7 is deposited by sputtering onto the entire substrate 1 while the substrate 1 is kept in the same chamber, in other words, the substrate 1 is not exposed to the atmosphere. Thus, no native $SiO_2$ film is generated on the substrate 1 during this process.

Figure 2C:
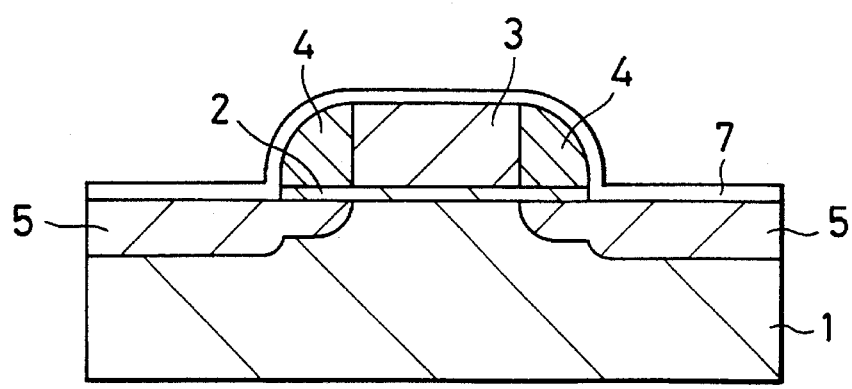

As shown in FIG. 2C, the Ti film 7 thus deposited is in contacted with the uncovered surface of the gate electrode 3 and the uncovered surfaces of the source/drain regions 5.

The substrate 1 is then subjected to a second heat-treatment process either in an inert atmosphere such as nitrogen (N) and argon (Ar) ones, or in vacuum at about 700° C. for about 10 seconds. This process is performed by lamp annealing.

Figure 2D:
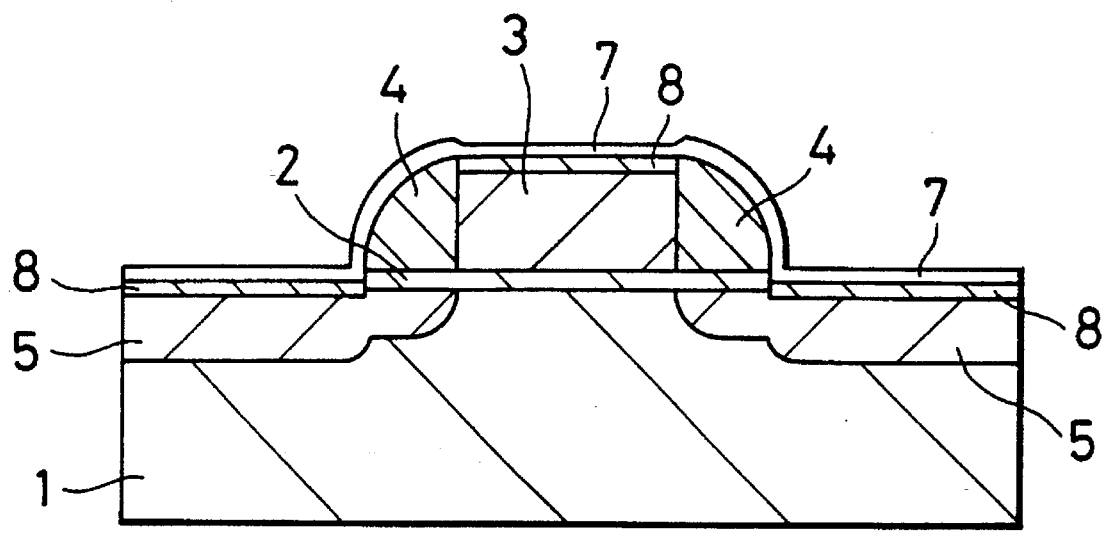

Through this process, the element Ti in the Ti film 7 reacts with the element Si in the polysilicon gate electrode 3 and that in the single-crystal Si source/drain regions 5 at their contact areas with the film 7. As a result, $TiSi_2$ films 8 with the C49 structures or phases is formed at the interface of the film 7 and the gate electrode 3 and at the interfaces of the film 7 and the source/drain regions 5, respectively, as shown in FIG. 2D.

Since the second heat-treatment process is carried out by lamp annealing, this process can be finished in a short time without damaging the substrate 1.

The unreacted Ti film 7 is then removed from the substrate 1 by chemical etching using the mixture solution of ammonia ($NH_3$) and hydrogen peroxide ($H_2O_2$). Following this, the substrate 1 is subjected to a third heat-treatment process at a temperature from 800° to 900° C. in the same atmosphere as that of the second heat-treatment by lamp annealing.

Figure 2E:
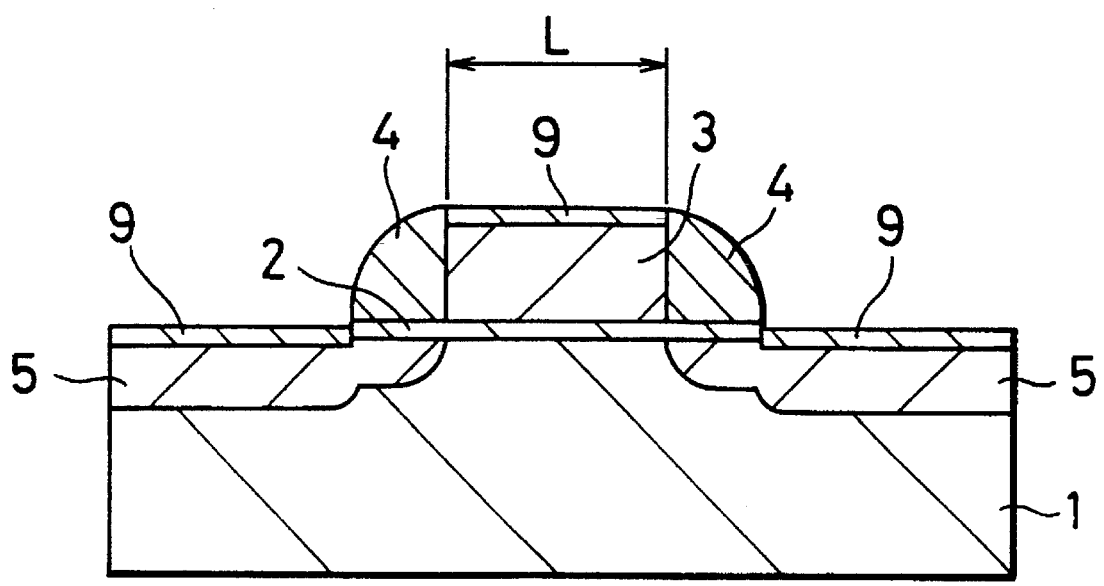

Through this process, The $TiSi_2$ films 8 with the C49 structures or phase of higher resistivity are transformed in phase to be $TiSi_2$ films 9 with C54 structures or phases of lower resistivity, as shown in FIG. 2E.

Thus, the MOSFETs having the C54-phase $TiSi_2$ films 9 is obtained.

As described above, with the method of the embodiment, since the native $SiO_2$ film is removed by reduction, using $H_2$, from the substrate 1 under the pressure of $1\times10^{-5}$ to $1\times10^{-2}$ Torr, and then, the refractory metal film 7 is formed on the entirety of the substrate 1 without exposing to the atmosphere.

Therefore, there is no possibility that an impurity is doped into the substrate 1 through its surface.

Also, because such the high-temperature annealing process over 800° C. as described above is not required, no problem occurs due to the agglomeration.

As a result, the silicide films 9 with a lower sheet resistance suitable for such the finely-structured MOSFET can be obtained without arising any problem.

In addition, breakdown or snapping of the $TiSi_2$ films 9 do not occur due to the agglomeration, so that the reliability of the films 9 are improved.

Figure 3:
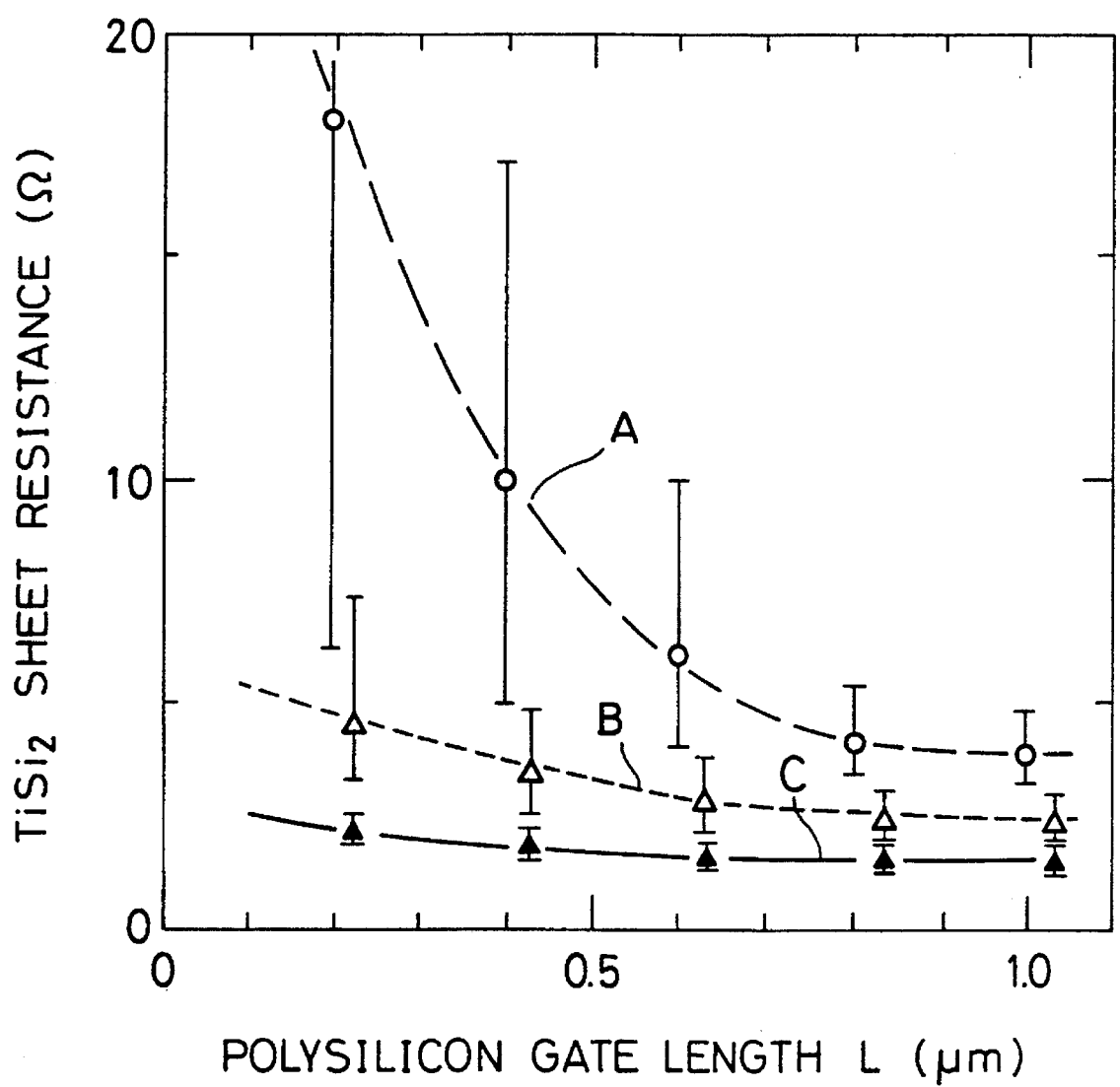
FIG. 3 is a graph showing the relationship between the sheet resistance of the refractory metal silicide film and the length of the polysilicon gate electrode according to the first and second conventional methods and the method of the invention.

FIG. 3 shows a relationship between the sheet resistance of the $TiSi_2$ film 9 and the length L (see FIG. 2E) of the polysilicon gate electrode 3, in which the broken line curves A and B are for the first and second conventional methods, respectively and the solid line curve C is for the embodiment of the invention.

From FIG. 3, it is seen that as the length L of the polysilicon gate electrode 3 decreases, the effect of the native oxide removing process to the $TiSi_2$ phase transformation increases. Also, this effect increases abruptly when L is about 0.8 μm or less in the first conventional method (curve A), and it increases gradually when L is about 1.0 μm or less in the second conventional method (curve B).

However, in the method of the embodiment (curve C), as clearly seen from FIG. 3, the applied effect to the transformation is smaller than those of the first and second conventional ones and it scarcely increases when L is 1.0 μm or less. Especially, such a small sheet resistance of 3 Ω or less can be advantageously obtained when L is 0.5 μm or less, which contributes to realization of semiconductor devices structured more fine.

In the embodiment, only $TiSi_2$ is shown as the refractory metal silicide; however, the invention can be applied to any other refractory metal silicides such as $CoSi_2$, $MoSi_2$, $NiSi_2$, $TaSi_2$, $WSi_2$.

While the preferred form of the present invention has been described, it is to be understood that modifications will be apparent to those skilled in the art without departing from the spirit of the invention. The scope of the invention, therefore, is to be determined solely by the following claims.

I claim:

1. A method of fabricating a semiconductor device, said method comprising the steps of:

performing a first heat-treatment process on a Si-containing substructure located in a vacuum chamber to remove a native $SiO_2$ film from a surface of said substructure by reduction in a hydrogen atmosphere having a chamber pressure in the range of approximately $1\times10^{-6}$ to $1\times10^{-2}$ Torr such that said surface of said substructure is exposed without damage or doping from said hydrogen atmosphere;

forming, in said vacuum chamber, a refractory metal film on said surface of said substructure without exposing said surface to the atmosphere to prevent formation of a second native oxide on said surface of said substructure;

performing a second heat-treatment process on said refractory metal film to react said refractory metal film with said substructure to form a refractory metal silicide film at an interface of said refractory metal film and said surface of said substructure; and removing an unreacted portion of said refractory metal film from said substructure.

2. The method as claimed in claim 1, wherein said substructure is one of a single-crystal silicon substrate and a polysilicon film.

3. The method as claimed in claim 1, wherein said pressure range of said hydrogen atmosphere is from approximately $1\times10^{-3}$ to $1\times10^{-4}$ Torr.

4. The method as claimed in claim 1, wherein said refractory metal film has a melting point of 1500° C. or higher.

5. The method as claimed in claim 1, wherein said second heat treatment process is carried out at a temperature from approximately 600° to 700° C. in one of an inert atmosphere and a vacuum atmosphere.

6. The method as claimed in claim 5, wherein said second heat-treatment process is carried out in a period of approximately 10 to 60 seconds.

7. The method as claimed in claim 1, wherein said refractory metal film is a Ti film and said refractory metal silicide film is a $TiSi_2$ film.

8. A method of fabricating a semiconductor device that includes at least one MOSFET, said method comprising the steps of:

performing a first heat-treatment process on a substrate located in a vacuum chamber to remove a native $SiO_2$ film from a surface of a polysilicon film formed on a portion of said substrate and from a surface of a least one diffusion region formed in said substrate by reduction in a hydrogen atmosphere having a pressure in a range of $1\times10^{-6}$ to $1\times10^{-2}$ Torr such that said surface of said polysilicon film and said surface of said at least one diffusion region are exposed without damage or doping from said hydrogen atmosphere;

forming, in said vacuum chamber, a refractory metal film on said surface of said polysilicon film and on said surface of said at least one diffusion region of said substrate without exposing said substrate to the atmosphere to prevent formation of a second native oxide on said surface of said polysilicon film and said surface of said at least one diffusion region;

performing a second heat-treatment process on said substrate to produce refractory metal silicide films of a first structure at an interface of said refractory metal film and said surface of said polysilicon film and at an interface of said refractory metal film and said surface of said at least one diffusion region by a reaction between a refractory metal element contained in said refractory metal films and a Si element contained in said polysilicon film and in said at least one diffusion region;

removing an unreacted portion of said refractory metal films from said substrate; and performing a third heat-treatment process on said substrate to transform said refractory metal silicide films of said first structure into refractory metal silicide films of a second structure having a lower resistivity than that of said refractory metal silicide films of said first structure.

9. The method as claimed in claim 8, wherein said pressure range of said hydrogen atmosphere is from approximately $1\times10^{-3}$ to $1\times10^{-4}$ Torr.

10. The method as claimed in claim 8, wherein said refractory metal film has a melting point of 1500° C. or higher.

11. The method as claimed in claim 8, wherein said second heat-treatment process is carried out at a temperature from approximately 600° to 700° C. in one of an inert atmosphere and a vacuum atmosphere.

12. The method as claimed in claim 11, wherein said second heat-treatment process is carried out in a period of approximately 10 to 60 seconds.

13. The method as claimed in claim 8, wherein said refractory metal film is a Ti film and said refractory metal silicide film is a TiSi$_2$ film.

14. The method as claimed in claim 1, further comprising the step of:

performing a third heat-treatment process on said refractory metal silicide film to lower its resistivity.

15. The method as claimed in claim 14, wherein said third heat-treatment process lowers said resistivity without causing agglomeration or flow of said refractory metal silicide film.

16. The method as claimed in claim 8, further comprising the steps of:

forming a gate insulator film on a portion of a single-crystal Si substrate;

forming a polysilicon film on said gate insulator film; and forming at least one diffusion region in said substrate.

17. The method as claimed in claim 16, wherein said at least one diffusion region comprises a pair of source/drain regions.

18. The method as claimed in claim 16, wherein said third heat-treatment process transforms said refractory metal silicide films without causing agglomeration or flow of said refractory metal silicide films.

* * * * *